Sept. 16, 1969 H. SCHMIDT 3,467,910
AMPLIFYING ARRANGEMENT HAVING AUTOMATIC GAIN CONTROL
Filed Nov. 16, 1967
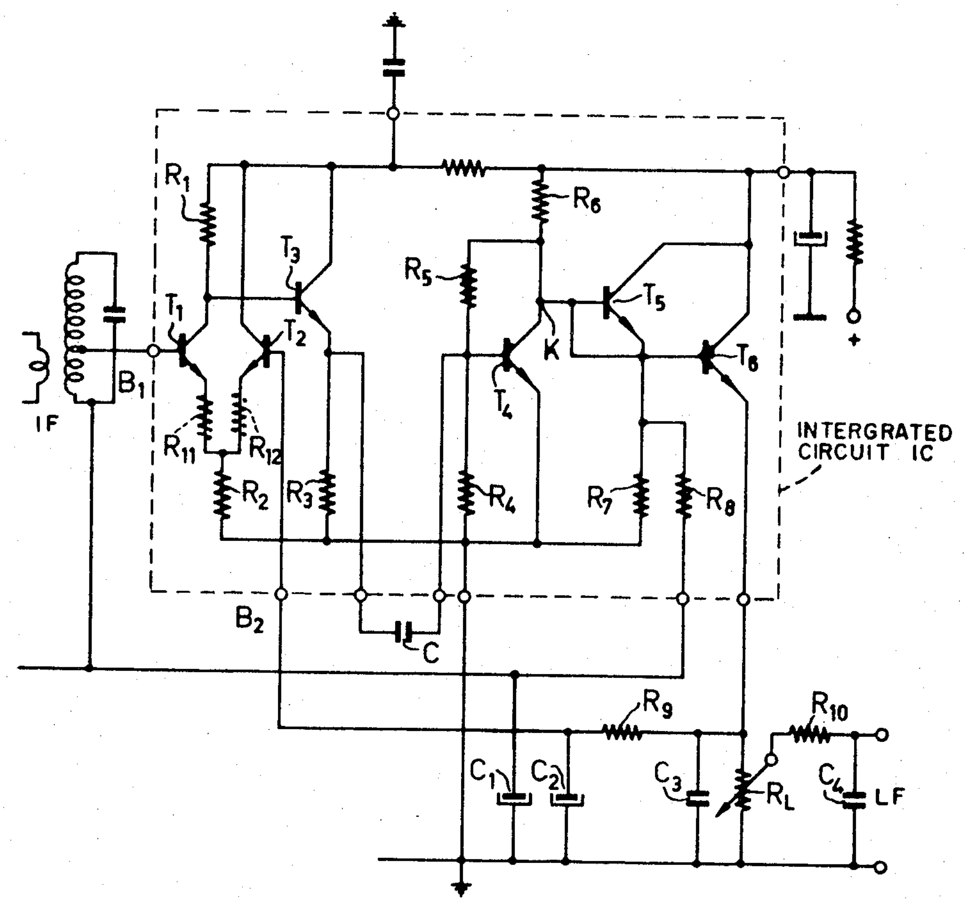
INVENTOR.
HEINER SCHMIDT
BY
Frank R. Jeifari
AGENT

3,467,910
AMPLIFYING ARRANGEMENT HAVING AUTOMATIC GAIN CONTROL

Heiner Schmidt, Harksheide, Germany, assignor, by mesne assignments, to U.S. Philips Corporation, New York, N.Y., a corporation of Delaware Filed Nov. 16, 1967, Ser. No. 683,585
Claims priority, application Germany, Dec. 17, 1966, P 41,028
Int. Cl. H03g 3/30
U.S. Cl. 330—29 7 Claims

ABSTRACT OF THE DISCLOSURE

A transistor amplifier circuit has a pair of emitter coupled transistors, with signals being applied to the base of one of these transistors. A pair of emitter followers have a common base circuit to which signals are applied. The emitter circuit of one emitter follower is designed to result in signal rectification, and this circuit is connected by way of a low pass filter to the base of one of the transistors. The emitter circuit of the other emitter follower has a large negative feedback, and this circuit is connected to the base of the other transistor by way of a low pass filter.

The invention relates to an amplifying arrangement having automatic gain control by using an amplifier comprising two transistors having a common emitter resistor. The invention has particularly for its object to take the specific properties of integrated amplifying circuits into account, since in these circuits resonant circuits and transformers cannot be employed and the available control-signal is usually very small.

Amplifying circuits are usually controlled so that a control-signal is applied to the input electrode of the amplifier to be controlled the magnitude of said signal depending upon the average amplitude of the signal to be amplified. If a transistor is employed as an amplifying element, a D.C. negative feedback has to be provided for protecting the circuitry from temperature fluctuations. For this purpose a voltage drop of 0.5 to 1 v. has to be produced across the negative feedback resistor included in the emitter lead, which voltage has to be supplied by the control-voltage source. In integrated amplifying circuits such high control-signals appear only exceptionally.

There has been proposed an amplifying circuit comprising two cathode-coupled tubes, in which the signal to be amplified is applied to one of the control-grids and the control-voltage depending upon the signal is applied to the other control-grid. Such an amplifying control-circuit, however, has to satisfy the condition that the reciprocal value of the mutual conductance should be low with respect to the common cathode resistor. If in this arrangement the tubes were replaced by transistors, the control-voltage has to be so high that a voltage drop of at least 0.5 v. is produced across the common emitter resistor in order to ensure that the reciprocal value of the mutual conductance becomes small with respect to the common emitter resistor. In the case of silicon transistors a base-emitter bias voltage of about 0.5 v. would, in addition, be required so that in total 1 volt had to be supplied. Such control-voltages are not available in integrated amplifying circuits.

In integrated circuits it is therefore efficacious to use a pair of emitter-coupled transistors and to apply a direct voltage to one of the base electrodes in accordance with the potential of a given point of the amplifier, whereas the other base electrode receives a control-voltage equal to the sum of this direct voltage and of a voltage depending upon the signal. Since the gain control is thus obtained by means of the difference between the two direct voltages, that is to say, solely the direct voltage depending upon the signal, a control can be achieved in such a circuit also by means of low control-voltages.

The invention is based on an amplifying circuit of the kind set forth and has for its object, particularly in the implementation of integrated-circuit technology, where inductances and capacitances have to be avoided as far as possible, to provide a direct voltage for the base electrode of one transistor and a control voltage for the base electrode of the other transistor. The amplifying circuit arrangement according to the invention is characterized in that the direct voltage for the first transistor ($T_1$) is derived from a first emitter follower ($T_5$) and the control-voltage for the other transistor ($T_2$) is derived from a second emitter follower ($T_6$), and the base electrodes of the two emitter followers are connected together to a point (K) of the amplifier and the second emitter follower ($T_6$) is operative as a signal rectified by decoupling ($C_3$) of its emitter circuit.

The invention and its advantages will be described more fully with reference to an embodiment shown in the drawing.

The drawing shows an intermediate-frequency amplifier whose amplifying portion proper is formed by the block IC outlined by broken lines formed in accordance with the integrated-circuit technology by a semiconductor element having various zones of different conductivity corresponding to the various circuit elements. In this part of the arrangement coils and capacitors cannot be employed. The intermediate-frequency signal is applied through a parallel resonant sircuit IF in the input circuit to the base $B_1$ of a transistor $T_1$ of a pair of transistors $T_1$, $T_2$ having intercoupled emitters by a resistor $R_2$. The amplification of the signal appearing at the collector of the transistor $T_1$ is a function of the direct collector current, which, in turn, depends upon the direct voltage difference between the bases $B_1$ and $B_2$ of the transistors $T_1$ and $T_2$. The amplified signal is applied through the emitter follower $T_3$ including the emitter resistor $R_3$ and the capacitor C to the base of a transistor $T_4$, the capacitor C serving to prevent the control-effect of the pair of transistors $T_1$ and $T_2$ from affecting the D.C. working point of the subsequent amplifier. The bias base voltage of the transistor $T_4$ is stalibised by the voltage divider $R_5$, $R_4$ between the collector and earth. The amplified signal across the collector resistor $R_6$ is applied to two emitter followers $T_5$ and $T_6$ (whose base electrodes are directly connected to the collector K of the transistor $T_4$. Of these emitter followers the follower $T_5$ has an emitter resistor $R_7$, which is not decoupled for the intermediate-frequency signal, whereas the emitter follower $T_6$ includes an emitter resistor RL, which is decoupled by means of a capacitor $C_3$ for the intermediate-frequency signal. The signal at the emitter of the transistor $T_5$ is smoothed by the low bandpass filter $R_8$, $C_1$ and the resultant direct voltage serves as a bias base voltage for the transistor $T_1$. If the RC-circuit RL, $C_3$ in the emitter circuit of the transistor $T_6$ is correctly proportioned, the intermediate-frequency signal is demodulated. The resultant low-frequency signal is applied from a tapping of the resistor $R_L$ via the smoothing filter $R_{10}$, $C_4$ to the input LF of the low-frequency amplifier. Moreover, the emitter voltage of the transistor $T_6$ is applied to a lowpass filter $R_9$, $C_2$ which suppresses the low-frequency components. The resultant control-voltage is applied to the base $B_2$ of the transistor $T_2$.

As long as an intermediate-frequency signal is lacking, the bias voltages of the transistors $T_1$ and $T_2$ are equal to each other, even in the event of temperature or supply voltage fluctuations. The currents passing through the two transistors $T_1$ and $T_2$ are thus equal to each other so that these fluctuations can substantially not affect the amplification control. However, as soon as an intermediate-frequency signal is applied, the base-emitter diode of the transistor $T_6$ operates as a signal rectifier, since the emitter resistor RL of this transistor is shunted for the intermediate-frequency signal by the capacitor $C_3$. The base-emitter diode of the transistor $T_5$ does not operate, however, as a signal rectifier due to the strong negative intermediate-frequency feedback provided by the emitter resistor $R_7$. As a result the voltage at the base $B_2$ of the transistor $T_2$ increases, since a signal-dependent direct-voltage component is superimposed on the component of the bias voltage which depends upon the collector K.

The current passing through the transistor $T_2$ will therefore increase, whereas the current passing through the transistor $T_1$ will decrease to the same extent so that the amplification of the transistor $T_1$ is reduced.

In this case the amplification of the transistor $T_1$ decreases with a decreasing collector current; consequently this transistor is controlled in the reverse direction. In order to drive the transistor $T_1$ in the forward direction, the base supply conductors have to be interchanged in order to have the amplification decrease with an increasing input signal.

A control depending upon a threshold value ("delayed" control) may be obtained by including in the emitter supply conductors of the transistors $T_1$ and $T_2$ resistors $R_{11}$ and $R_{12}$ (indicated by broken lines) which are small with respect to the common emitter resistor $R_2$. In this arrangement the collector current of the transistor $T_1$ will vary not until the bias base voltages of the two transistors differ by an amount exceeding the threshold value.

The use of the amplifying arrangement according to the invention is not restricted to intermediate-frequency amplifiers. For example, a self-oscillating mixing stage may be controlled in a similar manner, in which case the mixing amplifier is again formed by an emitter-coupled transistor amplifier and a direct voltage is applied to one base electrode which corresponds with the direct voltage of any point of the amplifier, whereas the other base electrode receives a control-voltage composed of said direct voltage and a component depending upon the average intermediate-frequency amplitude.

What is claimed is:

1. A transistor amplifier circuit comprising first, second, third and fourth transistors, a source of signals, means applying said signals to the base of said first transistor, a common emitter resistor connected to the emitters of said first and second transistors, collector load resistor means connected to the collector of said first transistor, means connected to apply signals from the collector of said first transistor to the bases of said third and fourth transistors in common, means connecting said third and fourth transistors as emitter followers having first and second emitter circuits respectively, said first emitter circuit comprising a parallel resistor-capacitor circuit whereby said third transistor functions as a signal rectifier, said second emitter circuit being primarily resistive at the frequency of said signals whereby said fourth transistor has a large negative feedback, low pass filter means for applying the emitter voltage of said third transistor to the base of one of said first and second transistors, and low pass filter means for applying the emitter voltage of said fourth transistor to the base of the other of said first and second transistors.

2. A circuit as defined in claim 1 wherein said second mentioned low pass filter means is coupled to the base of said first transistor and said first mentioned low pass filter means is coupled to the base of said second transistor.

3. A circuit as defined in claim 1 wherein both of said low pass filter means comprise series resistance shunt capacitance circuits.

4. A circuit as defined in claim 1 wherein said means connected to apply signals from the collector of said first transistor to the bases of said third and fourth transistors comprises means for defining an emitter follower circuit including a fifth transistor.

5. A gain controlled circuit for amplifying a modulated input signal comprising means for amplifying a difference in potential having first and second input terminals and a first output, means for coupling the input signal to one of said input terminals, means for controlling the gain of said difference amplifier comprising first means for generating a direct current signal having a value determined by current flow through said first means and having an input coupled to said first output and a second output coupled to one of said input terminals, second means for generating a direct current signal having a value determined by current flow through said second means and a control signal having an amplitude which is a function of the intensity of said modulated input signal, said second means having an input coupled to said first output and a third output coupled to the remaining input terminal.

6. A circuit as defined in claim 5 further comprising means for generating a threshold in said difference amplifier with respect to the amplitude of said input signal above which said gain control means is effective.

7. A circuit as defined in claim 5 wherein said first generating means is coupled to the same input terminal as said input signal.

References Cited

UNITED STATES PATENTS

| | | | |
|---|---|---|---|
| 2,929,998 | 3/1960 | Diehl. | |
| 3,267,388 | 8/1966 | Finkey et al. | 330—29 X |

ROY LAKE, Primary Examiner

JAMES B. MULLINS, assistant Examiner

U.S. Cl. X.R.

330—38, 134